(12) United States Patent
Yang et al.

(10) Patent No.: US 11,980,290 B2
(45) Date of Patent: May 14, 2024

(54) BLANK DUMMY STRUCTURE AND RACK

(71) Applicant: Fulian Precision Electronics (Tianjin) Co., LTD., Tianjin (CN)

(72) Inventors: Bin-Bin Yang, Tianjin (CN); Han-Yu Li, New Taipei (TW); Cheng-He Li, Tianjin (CN); Meng-Ya Cui, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/893,400

(22) Filed: Aug. 23, 2022

(65) Prior Publication Data
US 2023/0135533 A1 May 4, 2023

(30) Foreign Application Priority Data

Oct. 28, 2021 (CN) .......................... 202111264742.1

(51) Int. Cl.
*A47B 96/14* (2006.01)

(52) U.S. Cl.
CPC ...... *A47B 96/1441* (2013.01); *A47B 96/1408* (2013.01)

(58) Field of Classification Search
CPC ............ A47B 96/1441; A47B 96/1408; A47B 96/068; A47B 96/067; A47B 88/43; H05K 7/1489; H05K 7/183; F16M 13/022
See application file for complete search history.

(56) References Cited

U.S. PATENT DOCUMENTS

| | | | | |
|---|---|---|---|---|
| 7,357,362 B2* | 4/2008 | Yang | ...................... | A47B 88/43 |
| | | | | 248/245 |
| 8,353,494 B2* | 1/2013 | Peng | ...................... | A47B 88/43 |
| | | | | 248/221.11 |
| 9,717,333 B2* | 8/2017 | Chen | ...................... | A47B 88/43 |
| 9,854,911 B1* | 1/2018 | Chang | ...................... | A47B 88/43 |
| 10,051,759 B1* | 8/2018 | Chen | ...................... | A47B 57/485 |
| 10,149,538 B2* | 12/2018 | Chen | ...................... | A47B 88/43 |
| 10,278,498 B2* | 5/2019 | Chen | ...................... | A47B 88/483 |
| 10,292,493 B2* | 5/2019 | Chen | ...................... | H05K 7/1489 |
| 10,595,435 B2* | 3/2020 | Chen | ...................... | A47B 88/43 |
| 10,722,026 B2* | 7/2020 | Chen | ...................... | A47B 88/43 |
| 10,743,657 B2* | 8/2020 | Chen | ...................... | H05K 7/1489 |
| 11,510,334 B2* | 11/2022 | Tang | ...................... | H05K 7/14 |
| 2010/0072153 A1* | 3/2010 | Chen | ...................... | A47B 88/43 |
| | | | | 248/220.21 |

(Continued)

*Primary Examiner* — Devin K Barnett
(74) *Attorney, Agent, or Firm* — ScienBiziP, P.C.

(57) ABSTRACT

A blank dummy structure adaptable for slide rails and absence of slide rails, the blank dummy structure includes a main plate, two buckles, two rotating members, and two fasteners. The buckle comprises a snap component, the snap component is connected with the main plate to slide between first and second positions on the main plate. The rotating member and the snap component are arranged on the same side of the main plate, the rotating member on the main plate, comprises a limiting component. the rotating member being rotatably connected with the main plate to rotate the rotating member between a limit position and an avoidance position. The fastener configured to cooperate with the rack when the rotating member is in the avoidance position. The buckle, the rotating member, and the fastener are mounted on the main plate. A rack is also disclosed.

20 Claims, 10 Drawing Sheets

(56) References Cited

U.S. PATENT DOCUMENTS

2015/0201754 A1* 7/2015 Chen ................ A47B 96/07
                                                    248/219.3
2018/0360212 A1* 12/2018 Chen ................ H05K 7/1489

* cited by examiner

BLANK DUMMY STRUCTURE AND RACK

FIELD

The subject matter herein relates to a rack, especially relates to a blank dummy structure and rack.

BACKGROUND

A rack blank plate is used to fill the U position in the empty area of the rack, but the U position in the empty area may have slide rails or without slide rails. It is difficult for the existing blank plate of the rack to meet the two situations of the U position in the empty area with slide rails or without slide rails at the same time.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
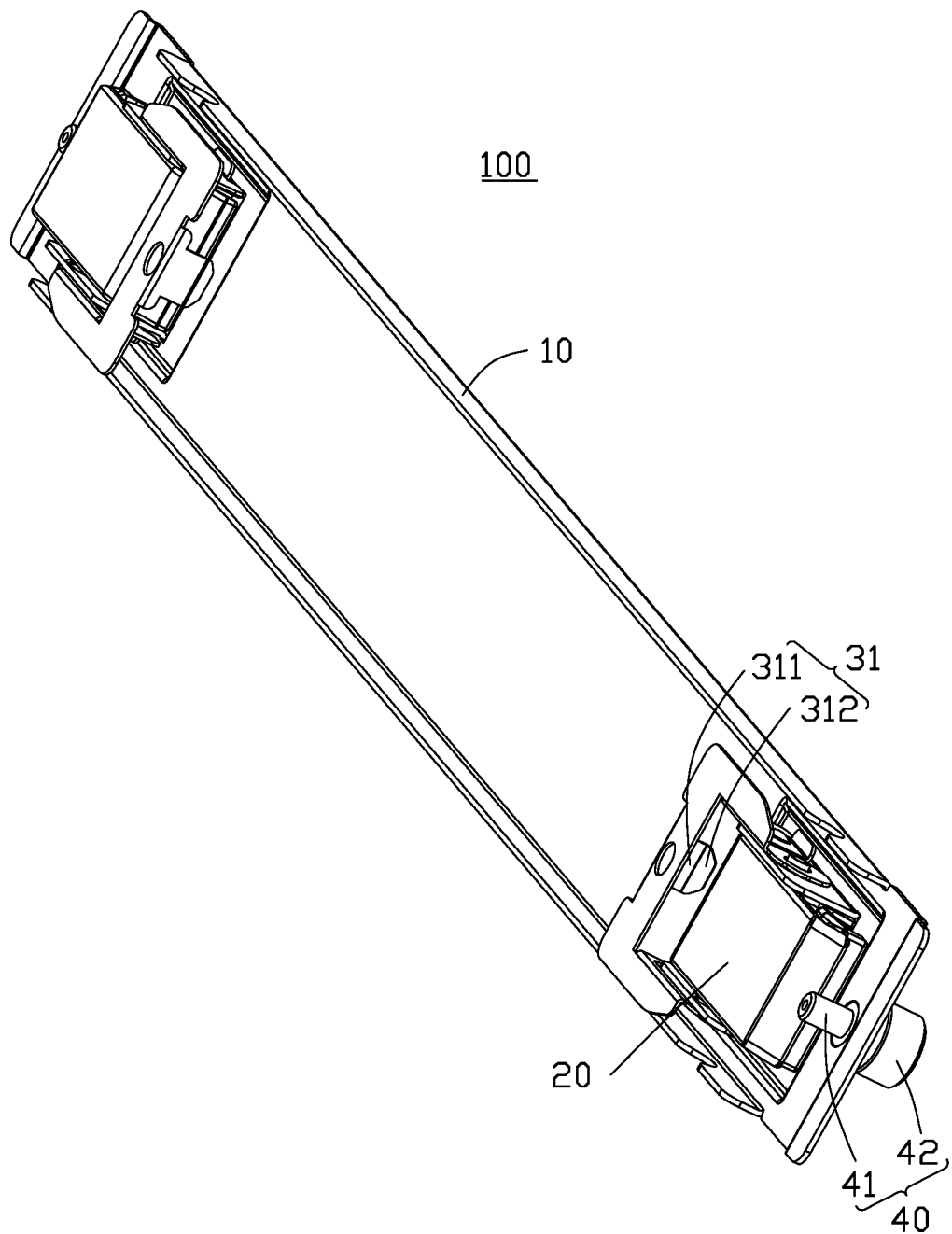
FIG. 1 is an isometric, assembled view of a blank dummy structure according to an embodiment of the present disclosure.

In order to make the above-mentioned objects, features, and advantages of the present application more obvious, a description of specific embodiments of the present application will be described with reference to the accompanying drawings. The present application can be implemented in many ways different from those described herein, and those skilled in the art can make similar improvements without violating the contents of the present application. Therefore, the present application is not to be considered as limiting the scope of the embodiments to those described herein.

Several definitions that apply throughout this disclosure will now be presented.

Unless otherwise defined, all technical and scientific terms used herein have the same meaning as commonly understood by one skilled in the art. The terms used in the present application herein are only for describing specific embodiments, and are not intended to limit the present application.

Referring to FIGS. 1 to 5, an embodiment of the present application provides a blank dummy structure 100 adaptable for slide rails 200 and absence of slide rails 200. The blank dummy structure 100 includes a main plate 10, two buckles 20, two rotating members 30, and two fasteners 40. Further, one of the two buckles 20, one of the two rotating members 30, and one of the two fasteners 40 are mounted on the one end of the main plate 10, and the other end of the main plate 10 is also mounted with the other buckle 20, the other rotating member 30, and the other fastener 40.

Figure 4:
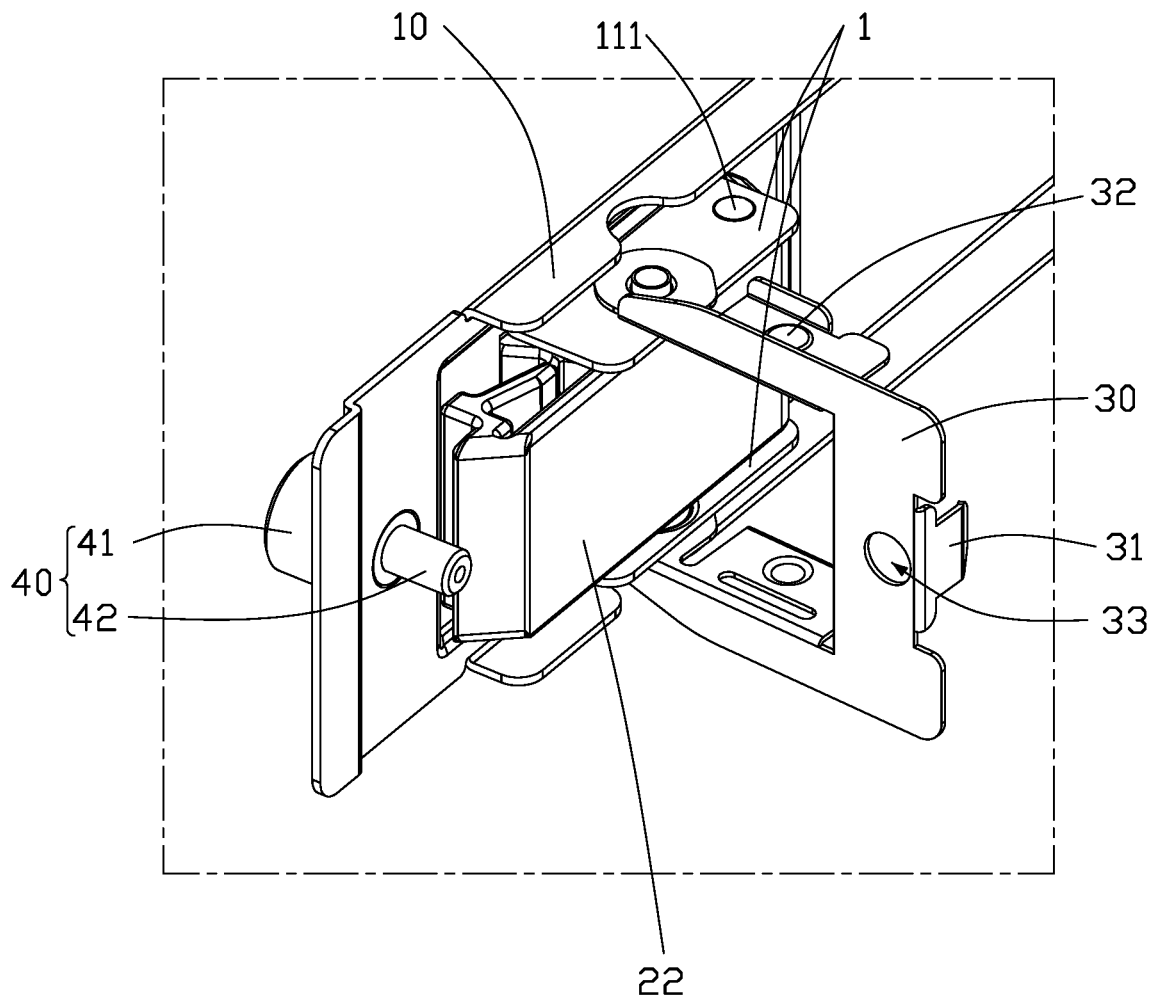
FIG. 4 is an enlarged view of delineated portion A in FIG. 3.

Referring to FIG. 4, each of the two buckles 20 includes a snap component 22. There is a gap between the snap component 22 and the main plate 10 forming a containment space between the snap component 22 and the main plate 10. The buckle 20 is slidably connected with the main plate 10. The buckle 20 can slide between a first position and a second position on the main plate 10. In the first position, the snap component 22 can abut against the rack 1000. In other words, a plate part of the rack 1000 can be clamped in the containment space. In the second position, the snap component 22 is separated from the rack 1000. The buckle 20 and the rack 1000 being snapped together limits the blank dummy structure 100 in the direction of approaching or moving away from the rack 1000.

Figure 5:
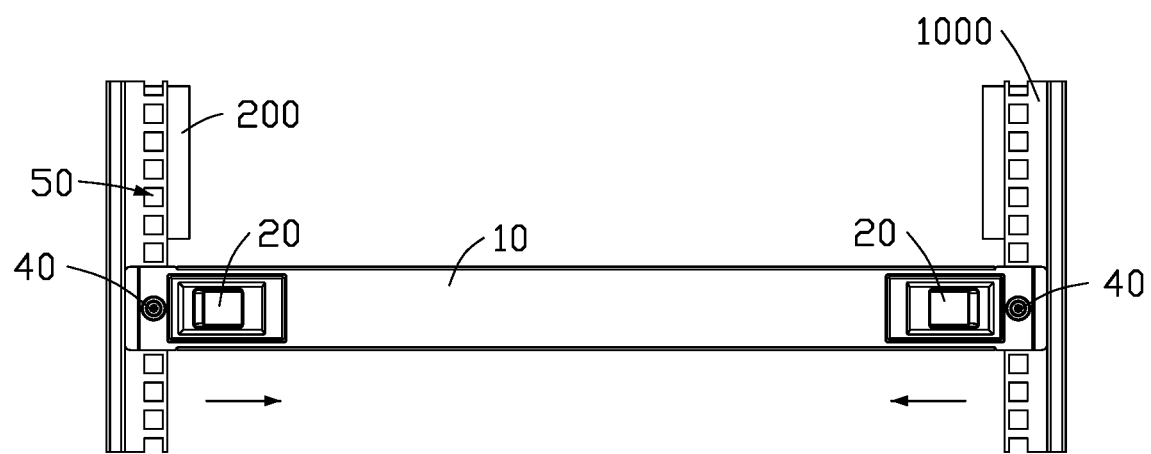
FIG. 5 is a front view of the rack according to an embodiment of the present disclosure.

Referring to FIG. 5, the buckles 20 at both of ends of the main plate 10 are clipped with the two inner sides of the rack 1000 that are opposite to each other. Before mounting the buckles 20 to the rack 1000, the buckles 20 at both of ends of the main plate 10 can be driven to move toward each other, so that the buckles 20 at both ends of the main plate 10 can pass through the two inner sides of the rack 1000. After passing through the two inner sides of the rack 1000, the buckles 20 at both ends of the main plate 10 are drive to move in a direction away from each other. The corresponding parts of the two inner sides of the rack 1000 can be inserted into the receiving space between the buckles 20 and the main plate 10.

Referring to FIG. 4, the rotating member 30 and the snap component 22 are arranged on the same side of the main plate 10, and the rotating member 30 is rotatably connected with the main plate 10. The rotating member 30 includes a limiting component 31. The rack 1000 defines a plurality of holes 50. The limiting component 31 is used for matching with the holes 50 of the rack 1000. The limiting component 31 extends into the holes 50 of the rack 1000 to limit the blank dummy structure 100. To reinforce the limiting effect, the limiting component 31 abuts against the hole 50 wall.

The rack 1000 is provided with a slide rail 200. The limiting component 31 interferes with the slide rail 200, so the limiting component 31 is used to cooperate with the rack 1000 when the slide rail 200 is not present. Therefore, the rotating member 30 is set to be rotatable relative to the main plate 10, so that the limiting component 31 has a limiting position that can cooperate with the hole 50 on the rack 1000, and take a position which does not interfere with the slide rail 200.

Referring to FIGS. 3 to 6, when the blank dummy structure 100 cooperates with the part of the rack 1000 provided with the slide rail 200, the rotating member 30 is driven to rotate so that the limiting component 31 is switched to a non-interfering position.

Referring to FIGS. 7 to 10, when the blank dummy structure 100 cooperates with the rack 1000 which does not have the slide rail 200, the rotating member 30 is driven to rotate so that the limiting component 31 is switched to the limiting position.

When the limiting component 31 cooperates with the rack 1000, the blank dummy structure 100 is limited in a direction parallel to its board surface. When the blank dummy structure 100 cooperates with the rack 1000 having slide rails 200, the rotating member 30 is in the non-interfering position, the fastener 40 provided on the main plate 10 needs to cooperate with the slide rail 200 in a limited position.

The fastener 40 may be a thumb screw or a combination of common bolt and nut. The fastener 40 is connected to the slide rail 200 by threaded connection. In another embodiment, the fastener 40 may also be a clip or other component. When the fastener 40 is the thumb screw, the blank dummy structure 100 can be quickly disassembled and assembled without tools.

Figure 6:
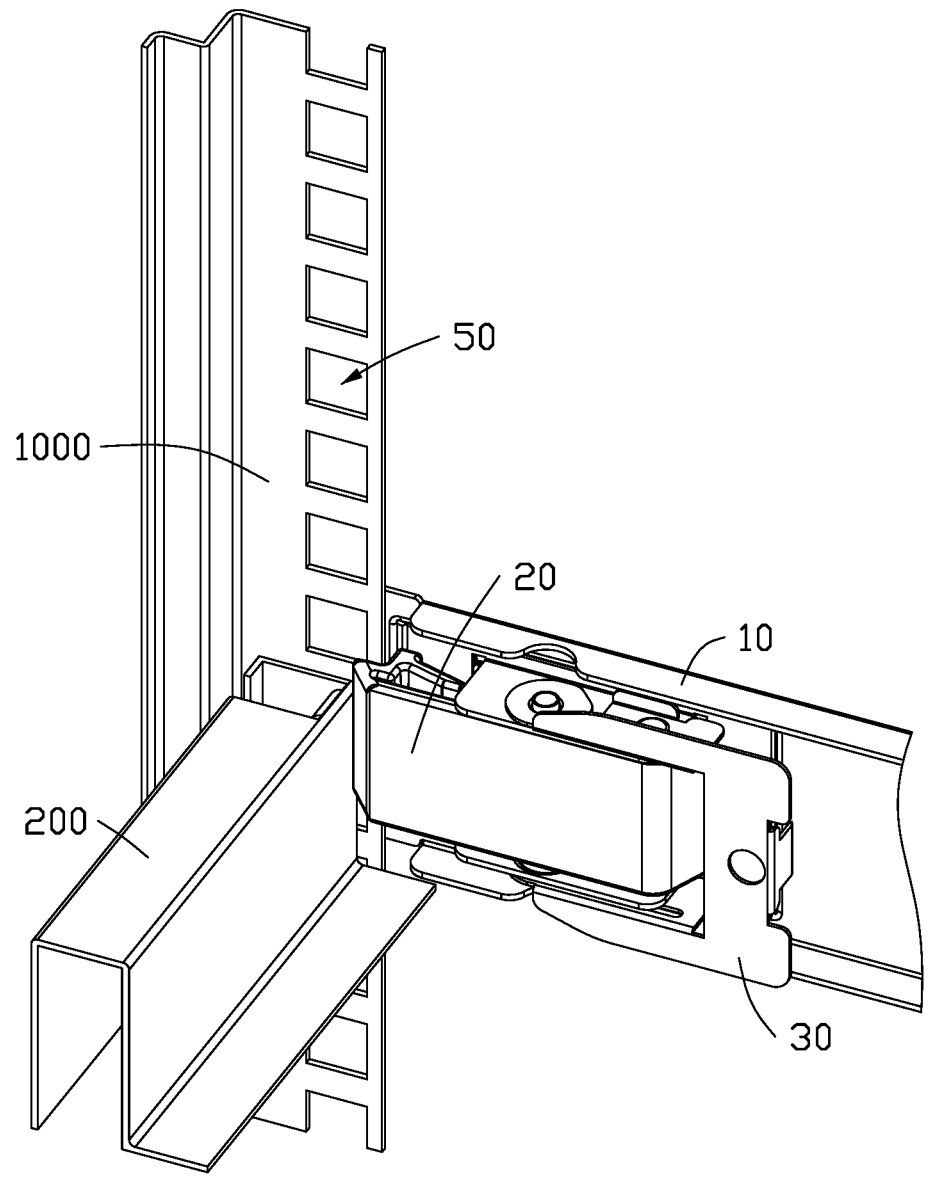
FIG. 6 is a schematic diagram of part of a rack in FIG. 5, the blank dummy structure and ft slide rails mounted on the rack are matched.

The buckle 20 can slide between the first position and the second position for snapping onto with the rack 1000. Referring to FIG. 6, when the buckle 20 and the rack 1000 are snapped together, the blank dummy structure 100 is limited in the direction of closing to or moving away from the rack 1000. When the rack 1000 has the slide rail 200, the blank dummy structure 100 connects to part of the slide rail 200. After the limiting component 31 is rotated, it is switched to the position which avoids the slide rail 200. The fastener 40 and the slide rail 200 are limited in cooperation, the blank dummy structure 100 is mounted on part of the slide rail 200.

Figure 9:
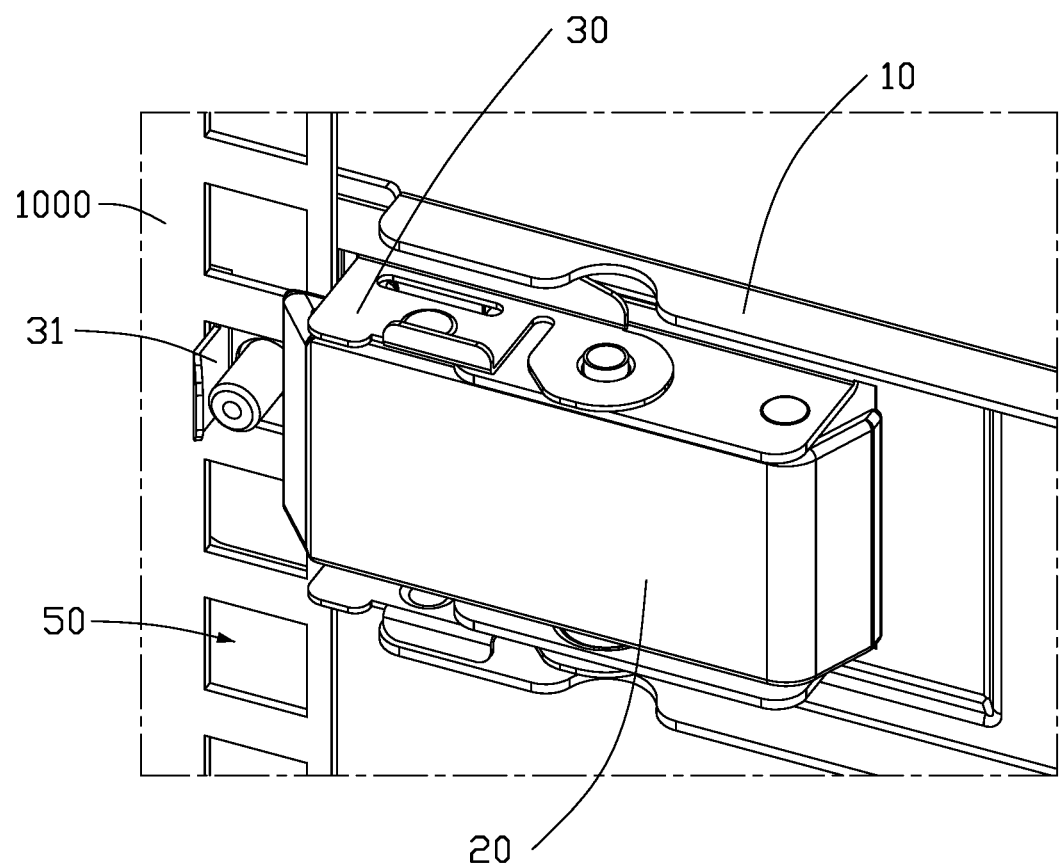
FIG. 9 is an enlarged view of delineated portion C in FIG. 8.

Referring to FIG. 9, when the rack 1000 has no slide rail 200, the blank dummy structure 100 is connected to part of the rack 1000. After the limiting component 31 is rotated, it is switched to the limiting position, and the limiting component 31 cooperates with the hole 50 of the rack 1000. The blank dummy structure 100 is limited in a direction parallel to its board surface, and the blank dummy structure 100 is mounted on part of the rack 1000.

Using the above two methods, the blank dummy structure 100 cam be connected with the rack 1000 which has the slide rail 200, and can also be connected to the rack 1000 without the slide rail 200, thereby improving the versatility of the blank dummy structure 100.

Referring to FIGS. 1, 5 and 6, in an embodiment, the two buckles 20 are mounted on opposite ends of the main plate 10, and the two buckles 20 are used to cooperate with the parts on the sides of the rack 1000. The two buckles 20 are configured to be able to slide toward or away from each other for ease of mounting.

The two buckles 20 slide in opposite directions for switching the buckles 20 to the first position, the two buckles 20 slide toward the center of the two buckles 20 for switching the buckles 20 to the second position. In other words, the buckles 20 at both ends of the main plate 10 are set to move away from each other, so that the buckles 20 are switched to the first position. Parts of the rack 1000 can be clamped by the snap components 22 at both ends of the main plate 10.

The buckles 20 at both ends of the main plate 10 are set to move toward each other, so that the buckles 20 are switched to the second position. The snap component 22 and the rack 1000 are thus disengaged.

Using the above two arrangements, the buckles 20 at the two ends of the main plate 10 snap onto the rack 1000, which not only ensures that the buckle 20 has a sufficient movement in the stroke, but also enables the buckle 20 to move within the extension range of the main plate 10, thereby saving installation space.

When the blank dummy structure 100 is mounted on the rack 1000, the buckle 20 is switched to the second position, then the blank dummy structure 100 can be moved to the preset installation position. Switching the buckle 20 to the first position, the snap component 22 is clamped onto the plate part of the rack 1000.

In an embodiment, the buckle 20 and the main plate 10 are elastically connected. The buckles 20 at both ends of the main plate 10 are pushed away from each other by the elastic action. The buckle 20 at both ends of the main plate 10 will remain in the first position without an external force.

When the blank dummy structure 100 is mounted on the rack 1000, and it is necessary to switch the buckle 20 to the second position, force is exerted to overcome the elastic effect to maintain the unlocked position, and then the blank dummy structure 100 can be moved to the position. Release the buckle 20, the buckle 20 is elastically forced back to the first position. Due to the elastic connection, the buckles 20 at both ends of the main body 10 are continuously under an elastic force, and thus pressed against the two inner sides of the rack 1000, providing a better clamping effect.

The buckle 20 may itself have an elastic part, and the elastic part is elastically connected with the main body 10. The buckle 20 may also be elastically connected with the main body 10 by other elastic members such as springs, torsion springs, elastic sheets, etc.

Figure 10:
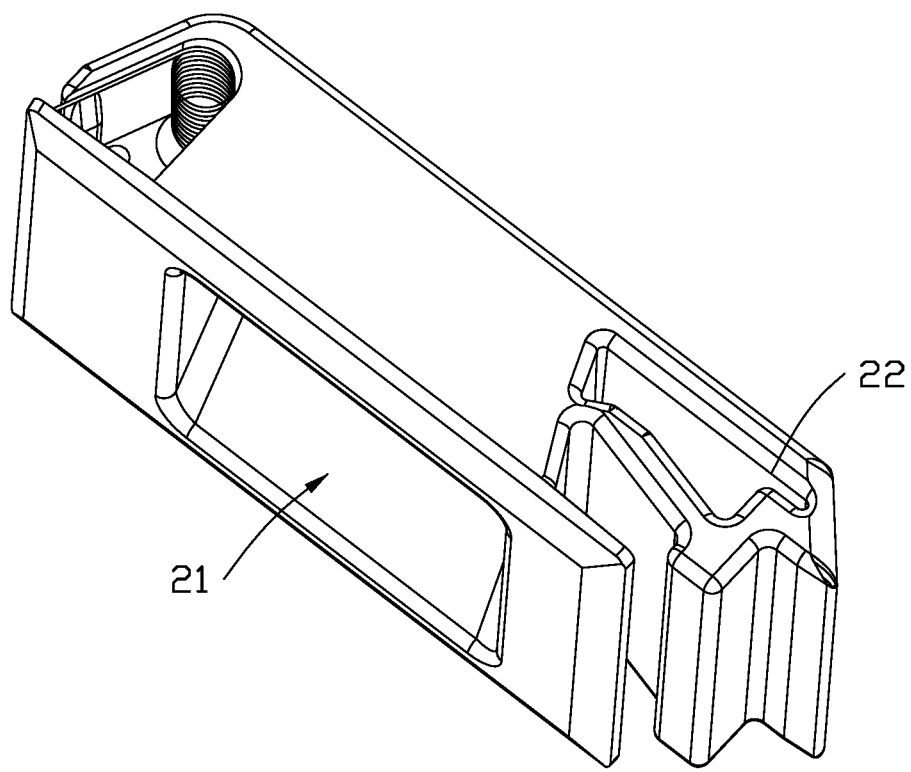
FIG. 10 is an isometric view of a buckle according to an embodiment of the present disclosure.

Referring to FIG. 10, in an embodiment, if a torsion spring is positioned in the buckle 20, one elastic leg of the torsion spring is connected to the buckle 20, and the other elastic leg of the torsion spring is used for connecting to the main plate 10.

The limiting position and the avoidance position of the rotating member 30 are usually located on the two opposite sides of the buckle 20.

Figure 3:
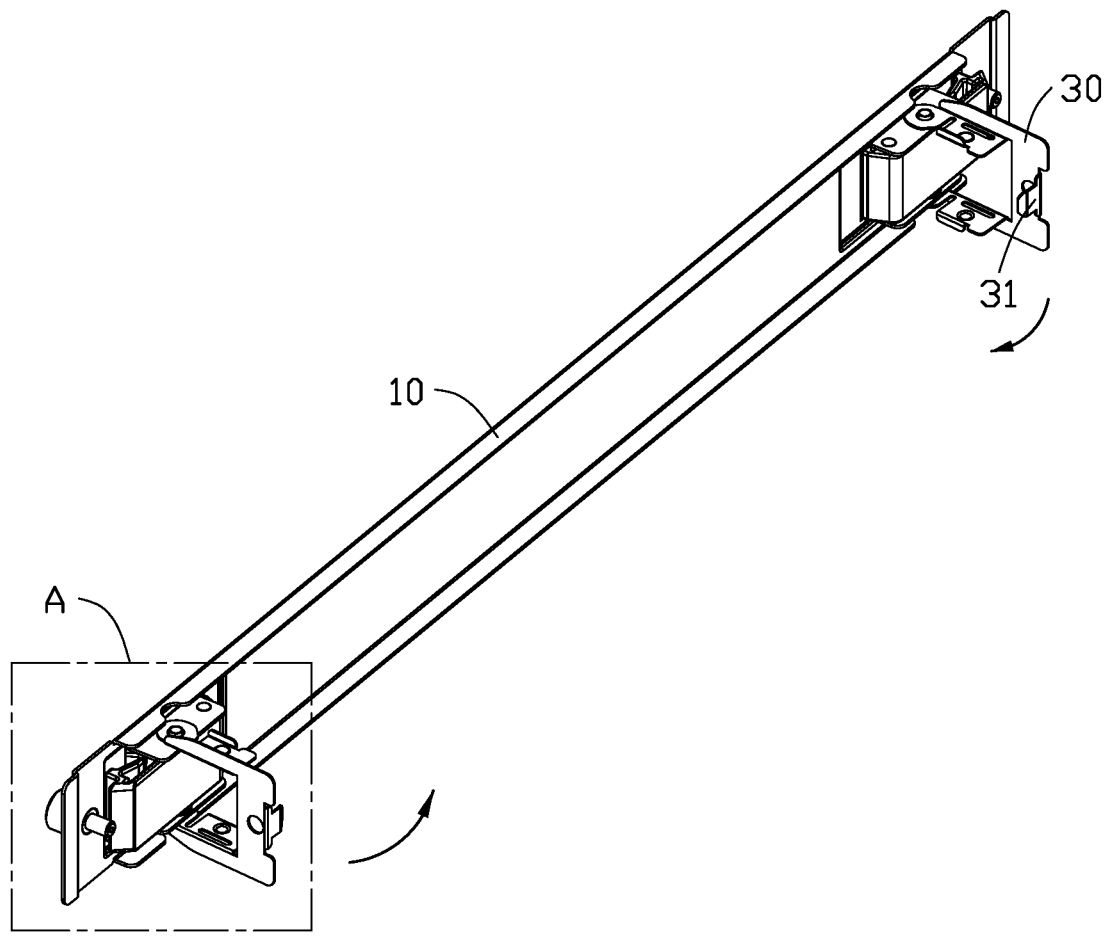
FIG. 3 is an isometric, assembled view of a limiting component switched toward an avoidance position according to an embodiment of the present disclosure.
Figure 7:
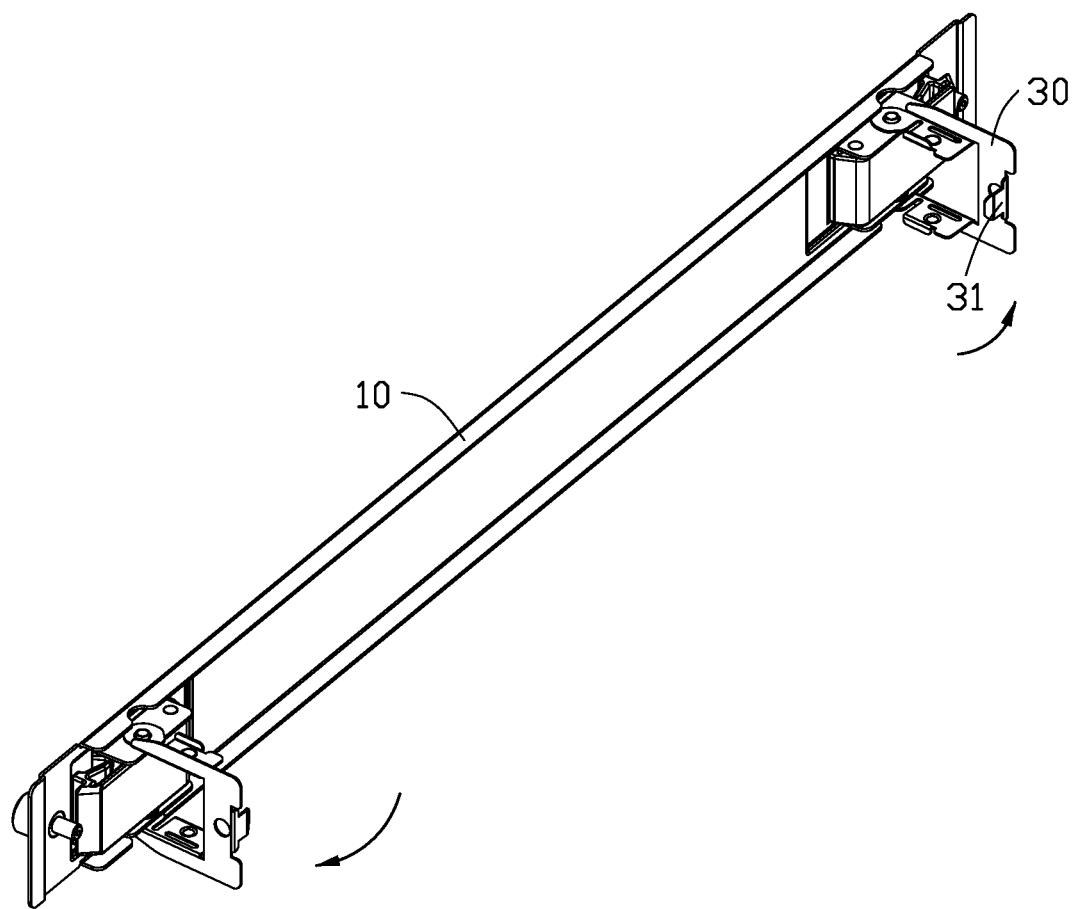
FIG. 7 is a schematic diagram of the limiting component switched toward a limiting position according to an embodiment of the present disclosure.
Figure 8:
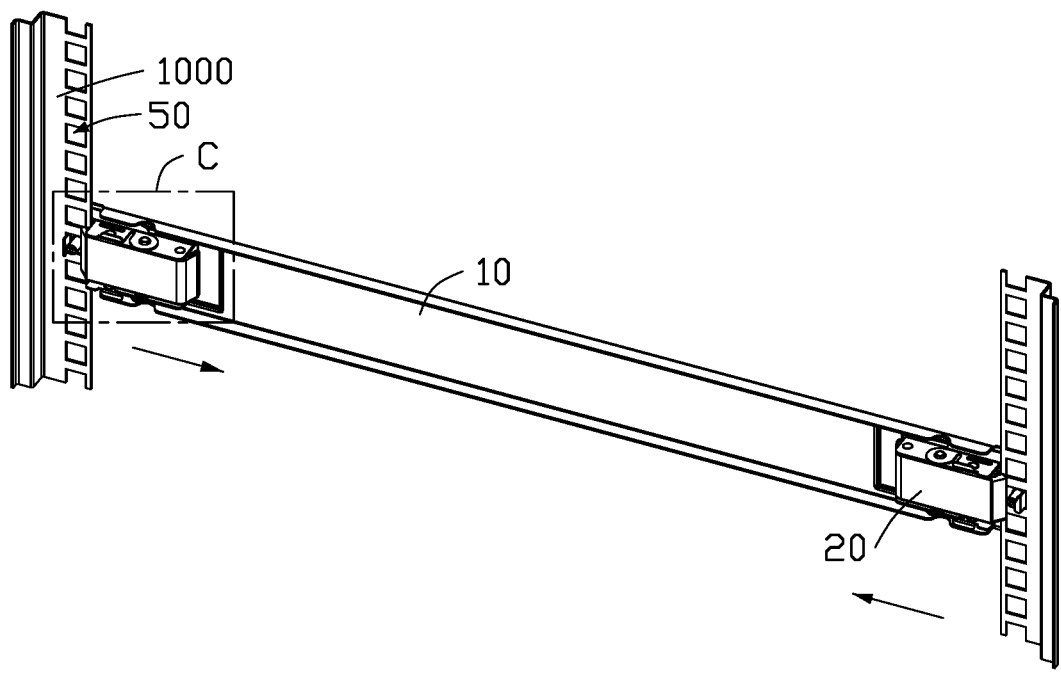
FIG. 8 is a schematic diagram of the blank dummy structure ready for use in cooperation of a non-sliding rail part of the rack.

Referring to FIGS. 3 and 7, in some embodiment of the present application, the rotating member 30 is pivotally connected to the main plate 10. The rotating member 30 can be rotated to switch between opposite sides of the buckle 20 for easy installation, thereby enabling the rotating member 30 to switch between the limiting position and the avoidance position.

The rotating member 30 may be arranged as a rectangular plate. In another embodiment, the rotating member 30 may also be arranged as a U-shaped plate or may be arranged in an arc-shaped plate.

Figure 2:
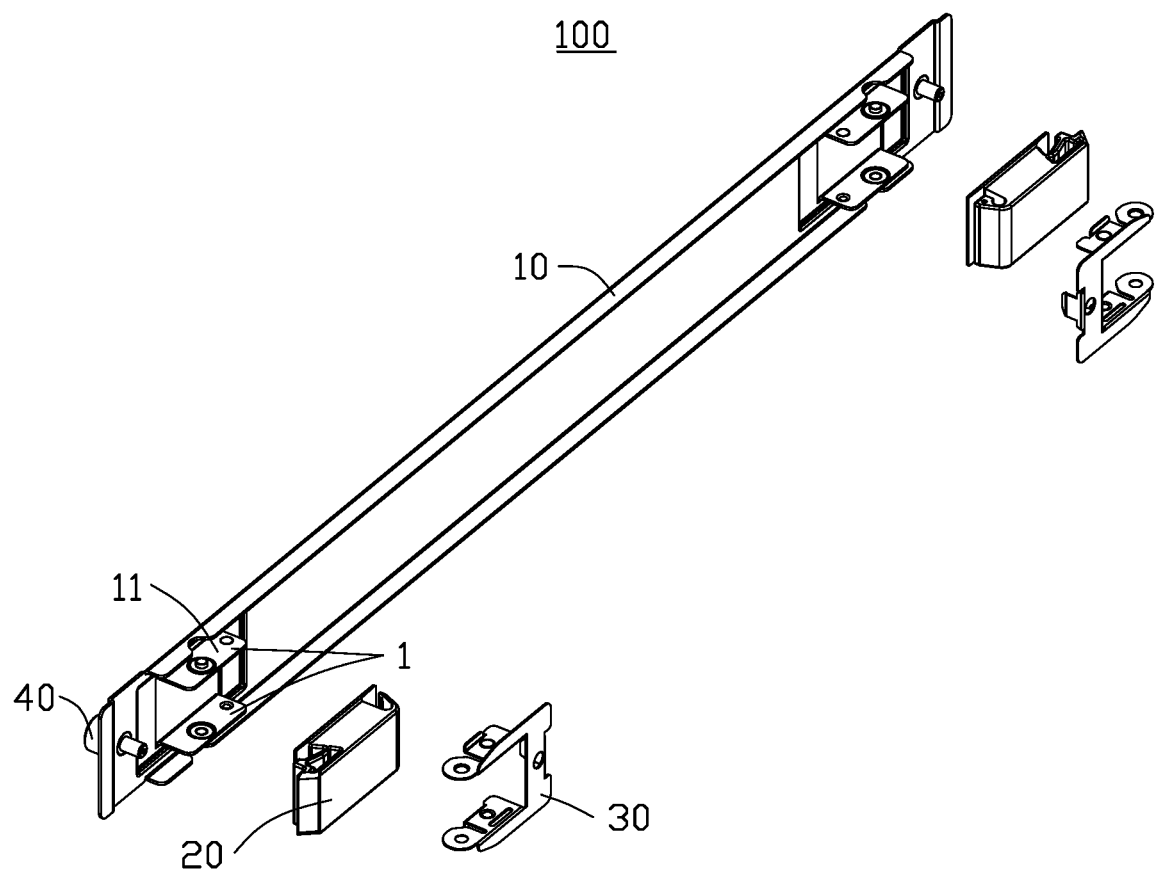
FIG. 2 is an isometric, exploded view of the blank dummy structure shown in FIG. 1.

Referring to FIGS. 1 and 2, in some embodiment of the present application, both ends of the main plate 10 on which the rotating member 30 is installed are provided with a fixing plate group 1. Each fixing plate group 1 includes two fixing plates 11 arranged opposite each other. The extending direction of each fixing plate 11 is the same as that of the main plate 10. Opposite sides of each rotating member 30 are pivotally connected to the corresponding fixing plates 11.

The fixing plate groups 1 at both ends of the main plate 10 can be understood as two sets of fixing plate 11 that are independent of each other. In other words, the main plate 10 is provided with four fixing plates 11, and each opposite end of the main plate 10 is provided with two fixing plates 11.

In another embodiment, the fixing plate groups 1 at both ends of the main plate 10 can be the same group of fixing plates 11. The main plate 10 is provided with two fixing plates 11, and each fixing plate 11 extends from one end of the main plate 10 to the other end.

Referring to FIG. 4, the inner side walls of the two fixing plates 11 of each fixing plate group 1 are provided with a positioning component 111, and the two outer side walls corresponding to the rotating member 30 are provided with accommodating components 32. Or, the outer side walls of the two fixing plates 11 of each fixing plate group 1 both are provided with a positioning component 111, and both inner side walls corresponding to the rotating member 30 are provided with an accommodating component 32. The positioning component 111 and the accommodating component 32 are connected when the rotating member 30 is in the non-interference position. The accommodating component 32 is contained within the positioning component 111. When the limiting component 31 needs to be switched to the non-interference position, the limiting component 31 can be maintained at the non-interference position. The positioning component 111 locates the rotating member 30 and prevents the rotating member 30 from shaking, to facilitate installation and transportation of the rack 1000.

When the rotating member 30 needs to be switched to the limiting position, the cooperating connection between the positioning component 111 and the accommodating component 32 can also be released. For example, the positioning component 111 is a hook, and the accommodating component 32 is a slot matched with the hook. Or, the positioning component 111 is a slot, and the accommodating component 32 is a hook matched with the slot.

Further, the positioning component 111 is a protrusion, and the accommodating component 32 is a groove matching with the protrusion. Or, the positioning component 111 is a groove, and the accommodating component 32 is a protrusion matching with the groove. The protrusion and the groove can be a circular protrusion and a circular groove. The circular protrusion and the circular groove have the advantages of simple structure and easy fabrication. The protrusion and the groove not only have a positioning effect on the rotating member 30, but also facilitate release of the positioning effect when required.

Referring to FIG. 1, in some embodiments of the present application, the limiting component 31 includes a first blocking part 311 and a second blocking part 312. One end of the first blocking part 311 is connected to the rotating member 30, the other end of the first blocking part 311 is connected to the second blocking part 312. The extending directions of the second blocking parts 312 at both ends of the main plate 10 are inclined toward the end where the rotating member 30 is connected to the main plate 10.

When the blank dummy structure 100 is mounted to the preset installation position on the rack 1000, and the limiting is in position, the first blocking part 311 and the second blocking part 312 extend into the holes 50 on the sides of the rack 1000. Since the extending direction of the second blocking part 312 at both ends of the main plate 10 is inclined toward the connecting end of the rotating member 30 and the main plate 10, when the operator manipulates the blank dummy structure 100, the second blocking part 312 can be in contact with the aperture of the hole 50 on the rack 1000. After adjustment by the operator, the first blocking part 311 and the second blocking part 312 can easily extend into the hole 50 of the rack 1000. Therefore, the second blocking part 312 plays a guiding role.

The first blocking part 311 and the second blocking part 312 may be integrally formed, or the first blocking part 311 and the second blocking part 312 may be connected and combined by connecting pieces.

Referring to FIGS. 4, and 8 to 10, in some embodiments of the present application, the blank dummy structure 100 also includes a fastener 40. The fastener 40 is connected with the slide rail 200 of the rack 1000. The rotating member 30 also includes an avoidance component 33. When the rotating member 30 is in the limiting position, the avoidance component 33 allows non-interference with the fastener 40.

The avoidance component 33 may be a through hole defined on the rotating member 30, or an avoidance notch defined on the rotating member 30.

The fastener 40 includes a connection section 41 and a fastening section 42. The connection section 41 is connected to the main plate 10. The fastening section 42 and the snap component 22 are arranged on the same side of the main plate 10. When the rack 1000 has the slide rail 200, the fastening section 42 can pass through the screw cap to connect the slide rail 200 and the fastener 40. In another embodiment, a threaded hole can be provided on the slide rail 200, the fastening section 42 is directly on the slide rail 200 and secured in the threaded hole.

The thumb screw can be directly locked by hand when the fastener 40 is a thumb screw, the blank dummy structure 100 can be quickly disassembled and assembled without tools.

Referring to FIG. 10, in some embodiments of the present application, the buckle 20 also includes an operation component 21. The operation component 21 and the snap component 22 are positioned on two sides of main plate 10. When installing the blank dummy structure 100, the operation component 21 can be held to adjust the installation position of the blank dummy structure 100, the buckles 20 at each end of the main plate 10 can be controlled to move toward or away from each other. The installation of the blank dummy structure 100 is time-saving and labor-saving by the operation unit 21.

The operation component 21 may be a groove structure or a protruding handle structure. The operation component 21 may also be other structure.

The present application also provides a rack 1000. The rack 1000 includes a blank dummy structure 100. The specific structure of the blank dummy structure 100 refers to the above embodiments. Since the rack 1000 adopts the technical solutions of the above embodiments, it has at least the technical solutions of the above embodiments.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A blank dummy structure adaptable for slide rails and absence of slide rails, the blank dummy structure comprising:
 a main plate;
 two buckles, each of the two buckles comprising a snap component, the snap component being connected with the main plate to slide between a first position and a second position on the main plate, wherein in the first position, the snap component abuts against a rack, and wherein in the second position, the snap component is separated from the rack;
 two rotating members, the rotating members and the snap components arranged on the same side of the main plate, and each rotating member comprising a limiting component, the rotating members being rotatably connected with the main plate to rotate the rotating members between a limit position and an avoidance position, wherein in the limit position, the limiting component cooperates with the rack, and wherein in the avoidance position, the limiting component avoids the rack; and two fasteners configured to cooperate with the rack when the rotating members are in the avoidance position;

wherein the buckle, the rotating members, and the fasteners are mounted on the main plate.

2. The blank dummy structure of claim 1, wherein:

the two buckles are configured to slide in opposite directions for switching the two buckles to the first position, and the two buckles are configured to slide toward a center point between the two buckles for switching the buckles to the second position.

3. The blank dummy structure of claim 2, wherein:

the two buckles and the main plate are elastically connected, the two buckles at both ends of the main plate is configured to be driven by an elastic action to slide in the opposite directions.

4. The blank dummy structure of claim 1, wherein:

each end of the main plate is provided with a fixing plate group, the fixing plate group comprises two fixing plates arranged oppositely, two opposite sides of each rotating member are pivotally connected to the corresponding fixing plates respectively.

5. The blank dummy structure of claim 4, wherein:

each fixing plate further comprises a positioning component, each rotating member comprises an accommodating components, the accommodating component being correspondingly positioned to the positioning component, the positioning component and the accommodating component are connected.

6. The blank dummy structure of claim 5, wherein:

the positioning component is a protrusion, and the accommodating component is a groove configured to matching with the protrusion.

7. The blank dummy structure of claim 5, wherein:

the positioning component is a groove, and the accommodating component is a protrusion configured to matching with the groove.

8. The blank dummy structure of claim 1, wherein:

the limiting component comprises a first blocking part and a second blocking part, and one end of the first blocking part is connected to the rotating member, and the other end of the first blocking part is connected to the second blocking part, and an extending direction of the second blocking part is inclined toward the end where the rotating member is connected to the main plate.

9. The blank dummy structure of claim 1, wherein:

each fastener comprises is a thumb screw, each rotating member comprises an avoidance component configured to avoiding the thumb screw.

10. The blank dummy structure of claim 1, wherein:

each buckle comprises an operation component, the operation component and the snap component are respectively positioned on two sides of main plate.

11. A rack comprising:

a plurality of holes defined on the rack; and a blank dummy structure adaptable for absence of slide rails, the blank dummy structure comprising:
 a main plate;
 two buckles, each of the buckles comprising a snap component, the snap component being connected with the main plate to slide between a first position and a second position on the main plate, wherein in the first position, the snap component abuts against the rack, and wherein in the second position, the snap component is separated from the rack;

two rotating members, the rotating member and the snap component arrange on the same side of the main plate, and each rotating member comprising a limiting component, the rotating member being rotatably connected with the main plate to rotate the rotating members between a limit position and an avoidance position, wherein when the limiting component is located at the limiting position, the limiting component extends into the holes; and two fasteners configured to cooperate with the rack when the rotating members are in the avoidance position, wherein the buckle, the rotating members, and the fasteners are mounted on the main plate.

12. The rack of claim 11, wherein:

the two buckles are configured to slide in opposite direction for switching the two buckles to the first position, the two buckles are configured to slide toward a center point between the two buckles for switching the buckles to the second position.

13. The rack of claim 12, wherein:

the two buckle and the main plate are elastically connected, the two buckles at both ends of the main plate is configured to be driven by an elastic action to slide in the opposite directions.

14. The rack of claim 11, wherein:

each end of the main plate is provided with a fixing plate group, the fixing plate group comprises two fixing plates arranged oppositely, two opposite sides of each rotating member are pivotally connected to the corresponding fixing plates respectively.

15. The rack of claim 14, wherein:

each fixing plate further comprises a positioning component, each rotating member comprises an accommodating components, the accommodating component being correspondingly positioned to the positioning component, the positioning component and the accommodating component are connected.

16. A rack comprising:

a slide rail mounted on the rack; and a blank dummy structure adaptable for the slide rail, the blank dummy structure comprising:
 a main plate;
 two buckles, each of the buckles comprising a snap component, the snap component being connected with the main plate to slide between a first position and a second position on the main plate, wherein in the first position, the snap component abuts against the rack, and wherein in the second position, the snap component is separated from the rack;

two rotating members, the rotating member and the snap component arrange on the same side of the main plate, and each rotating member comprising a limiting component, the rotating member being rotatably connected with the main plate to rotate the rotating member between a limit position and an avoidance position, when the slide rail mounted on the rack, the limiting component located at the avoidance position; and two fasteners, the fasteners connected to the slide rail when the rotating members are in the avoidance position;

wherein the buckle, the rotating members, and the fasteners are mounted on the main plate.

17. The rack of claim 16, wherein:

the two buckles are configured to slide in opposite direction for switching the two buckles to the first position, the two buckles are configured to slide toward a center of the two buckles for switching the buckles to the second position.

18. The rack of claim 17, wherein:

the two buckle and the main plate are elastically connected, the two buckles at both ends of the main plate is configured to be driven by an elastic action to slide in the opposite direction.

19. The rack of claim 16, wherein:

each end of the main plate is provided with a fixing plate group, the fixing plate group comprises two fixing plates arranged oppositely, two opposite sides of each rotating member are pivotally connected to the corresponding fixing plates respectively.

20. The rack of claim 19, wherein:

each fixing plate further comprises a positioning component, each rotating member comprises an accommodating components, the accommodating component being correspondingly positioned to the positioning component, the positioning component and the accommodating component are connected.

* * * * *